United States Patent [19]

Vogel

[11] 4,138,667
[45] Feb. 6, 1979

[54] SEGMENT DIGITAL/ANALOGUE CONVERTER

[75] Inventor: Paul Vogel, Bern, Switzerland

[73] Assignee: Hasler AG, Bern, Switzerland

[21] Appl. No.: 797,189

[22] Filed: May 16, 1977

[30] Foreign Application Priority Data

May 17, 1976 [CH] Switzerland .......................... 6119/76
Jun. 2, 1976 [CH] Switzerland .......................... 6903/76

[51] Int. Cl.$^2$ ........................................... H03K 13/02
[52] U.S. Cl. ............................................ 340/347 DA
[58] Field of Search ................... 340/347 M, 347 DA; 360/40

[56] References Cited

U.S. PATENT DOCUMENTS

| 3,588,836 | 6/1971 | Frazier | 360/40 |
| 3,678,504 | 7/1972 | Kaneko | 340/347 M |

OTHER PUBLICATIONS

Degryse "IEEE Transactions on Computers" vol. C-21, No. 11, Nov. 1972, pp. 1165-1168.

*Primary Examiner*—Charles D. Miller
*Attorney, Agent, or Firm*—Brady, O'Boyle & Gates

[57] ABSTRACT

A segment digital/analogue converter for conversion of an eight-bit PCM-work into an analogue output voltage in accordance with the CCITT A-law, with a weighting network and a stepwise switched operational amplifier, with inputs for connection of each bit of said PCM-word with said weighting network and said amplifier via digital gates and low-impedance switches and with a control line for controlling the sign of said output voltage in accordance with the sign-bit of the PCM-word. The converter is characterized by connection to ground of both ends of the weighting network's resistor chain, by two resistors for the continuous resp. the switched input of each a predetermined current to the output line of the weighting network and by a switchable voltage divider at the output of the stepwise switched amplifier.

1 Claim, 5 Drawing Figures

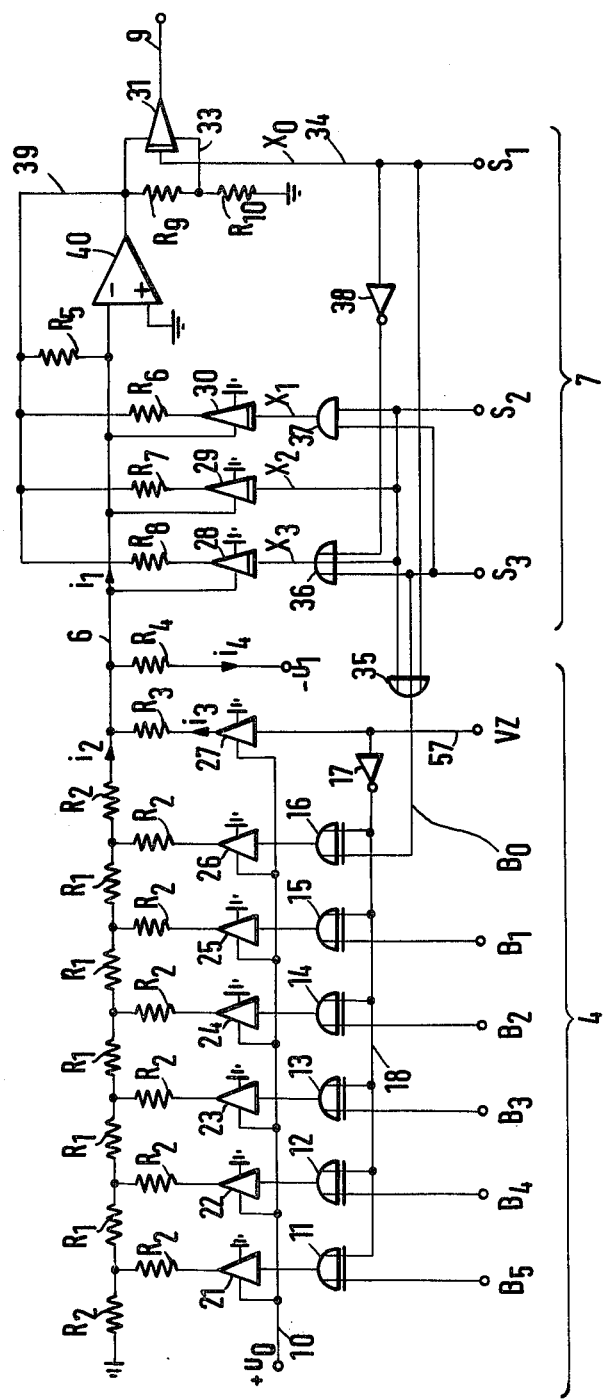

SEGMENT DIGITAL/ANALOGUE CONVERTER

FIELD OF THE INVENTION

This invention relates to a segment digital/analogue converter for conversion of an eight bit PCM-word into an analogue output voltage in accordance with the CCITT A-law, with a weighting network including a resistor chain and a stepwise switched operational amplifier, with inputs for connection of each bit of said PCM-word with said weighting network and said amplifier via digital gates and low-impedance switches and with a control line for controlling the sign of said output voltage in accordance with the sign-bit of the PCM-word.

Such segment digital/analogue converters are the hardware realization of the coding laws (A-Law or μ-Law) laid down by a CCITT recommendation. They thus allow the construction of Codecs which form a possible intersection point between the digital and the analogue technique in telecommunication, the analogue technique being represented by speech modulated direct currents, for example.

A whole series of such digital/analogue converters are known. Thus, for example, U.S. Pat. No. 3,678,504 shows a segment digital/analogue converter which consists of a weighting network and a subsequent switchable amplifier. The weighting network is connected via switches to the reference voltages $+E$ and $-E$. The switches are actuated by the bits $B_1$, $B_2$, $B_3$, $B_4$ of the PCM word that is to be decoded.

Only with difficulty can this converter be controlled by a complementary MOS logic. Further the signal dynamic according to the A- and μ-Law, is so large that there is danger of leakage currents arising from semiconductor switches and/or zero point errors of amplifiers. These possible faults can disturb the correct function of a digital/analogue converter considerably.

OBJECT OF THE INVENTION

An object of the present invention is to provide an analogue/digital converter which can be controlled by a complementary MOS logic which is simple to produce as an integrated circuit, and whose output can be switched over from a positive to a negative value or vice versa without effecting a step in the reference voltage level.

BRIEF STATEMENT OF THE INVENTION

The invention provides a segment digital/analogue converter for conversion of an eight-bit PCM-word into an analogue output voltage in accordance with the CCITT A-law, with a weighting network and a stepwise switched operational amplifier, with inputs for connection of each bit of said PCM-word with said weighting network and said amplifier via digital gates and low-impedance switches and with a control line for controlling the sign of said output voltage in accordance with the sign-bit of the PCM-word, comprising an electrical connection to ground of the one end of the weighting network's resistor chain, an electrical connection of the other end of the resistor chain, to the first input of an operational amplifier, and connection of the second input of the amplifier to ground, a first resistor ($R_4$), which connects the output (6) of the weighting network to a negative reference voltage ($-U_1$), the value of said first resistor ($R_4$) being such to give rise of a current ($i_4$) being equal in value to the maximum possible output current of said weighting network, a second resistor ($R_3$), which connects the output (6) of said weighting network to a first low-impedance switch (27), which is controlled by the sign-bit (VZ) of said PCM-word and which switches said second resistor ($R_3$) either to ground or to a positive reference voltage ($+U_o$), the value of said second resistor also being such to give rise of a current ($I_3$) being equal in value to the maximum possible output current of said weighting network, a voltage divider ($R_9$, $R_{10}$) having a resistance ratio of 15:1, which connects the output (39) of the operational amplifier (40) to ground, and a second low-impedance switch (31) which is controlled by the most significant bit $S_1$) of said PCM-word and which is connected to connect either the output (39) of the operational amplifier (40) or the tap (33) of said voltage divider ($R_9$, $R_{10}$) to the output (9) of the segment digital-/analogue converter.

BRIEF DESCRIPTION OF THE DRAWINGS

The invention will be described further, by way of example with reference to the accompanying drawings, in which:

FIG. 3 shows a circuit of a segment digital/analogue converter in accordance with the invention.

DESCRIPTION OF A PREFERRED EMBODIMENT

Figure 1:
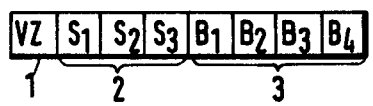
FIG. 1 is a diagram showing the format of a PCM word.

The pulse code modulation (PCM) of speech signals was laid down internationally by the CCITT Standard G.711. According to this, each PCM word consists of 8 bits, which represent an analogue sampling value. FIG. 1 shows the format of such a PCM word. It consists of three parts, which are designated by 1, 2 and 3. Part 1 comprises only the bit VZ, which indicates the sign. A logical 1 corresponds to a positive sampling value and a 0 corresponds to a negative sampling value. Part 2 comprises the bits $S_1$, $S_2$, $S_3$ and part 3 comprises the bits $B_1$, $B_2$, $B_3$, $B_4$.

The bits of parts II and III form the binary numbers S and B respectively. Associated with these numbers are analogue values, for example, voltage values. The function between these two magnitudes is called A-Law.

The A-Law is a function which is composed of several linear sections, the so-called segments. The binary number S formed by the bits $S_1$, $S_2$, $S_3$ of part 2 indicates the segment, and the bits $B_1$, $B_2$, $B_3$, $B_4$ of part 3 indicate one of 16 points in the segment. Thus $2 \times 128$ different PCM words can be formed. Associated with these PCM words are analogue values ranging from $+1$ to $+4032$ and $-1$ to $-4032$.

Figure 2:
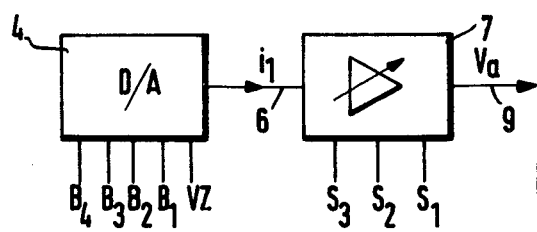
FIG. 2 shows a block diagram of a segment digital-/analogue converter.

FIG. 2 shows the basic construction of the segment digital/analogue converter. According to this it consists of a linear D/A converter 4, which is connected via a line 6 to a switchable current-voltage converter 7. The D/A converter 4 has five inputs, to which the bits VZ, $B_1$, $B_2$, $B_3$, $B_4$ are applied as input signal, while the bits $S_1$, $S_2$ and $S_3$ are applied to the inputs of the current-voltage converter 7. The output signal, i.e. the analogue voltage $V_a$ corresponding to the PCM word, appears on the output line 9.

The analogue voltage $V_a = V_0$. For the PCM word with S = 0, B = 0 as smallest possible amount. For B ≠ 0, $V_a$ is increased stepwise by a fixed amount, 2, $V_o$ in the first and second segment, which is 4. $V_o$, in the third by 8. $V_o$, in the fourth segment and so forth, respectively doubling up to 128. $V_o$ in the eighth segment (S = 7).

FIG. 3 shows the detailed circuit diagram of the segment digital/analogue converter. The linear D/A converter 4 consists of a known binary weighting network, assembled of the resistors $R_1$ and $R_2$, the resistance values being $R_2 = 2R_1$. In this way the weighting network forms a R—2R— branch circuit. The altogether six cross resistors $R_2$ are controlled by six identical switches 21 . . . 26, which are themselves controlled by six EXOR gates 11 . . . 16. Each of these gates is connected with an input to a common control line 18. The other inputs of the gates 12 . . . 15 serve for the input of the bits $B_4$, $B_3$, $B_2$ and $B_1$ of the PCM word and are designated accordingly. The input $B_5$ of the gate 11 and the input $B_o$ of the gate 16 will be described later on.

The control line 18 is controlled via an inverter 17 from the input designated VZ. This input controls, moreover, the switch 27, which connects one pole of a resistor $R_3$ either to the potential $+U_o$ or to earth. The other pole of this resistor $R_3$ is connected to the output 6 of the linear D/A converter. Between this output 6 and a negative reference voltage $-U_1$ lies a resistor $R_4$.

Changing the state of one of the two inputs of each switch 21 . . . 26 from 0 to 1 results in a reversing of the switch output from potential 0 (earth) to potential $+U_o$ therewith a partial current $i_2$ amounts on the output line 6, being for the switch 21 = 1 . $i_o$
for the switch 22 = 2 . $i_o$
1 . $i_o$ for switch 21
2 . $i_o$ for switch 22
4 . $i_o$ for switch 23
. . .
. . .
. . .
32 . $i_o$ for switch 26.

Different partial currents $i_2$ add themself linearly.

The current-voltage converter 7 comprises an operational amplifier 40, which is back-coupled via the line 39 and the resistances $R_5$, $R_6$, $R_7$, $R_8$. The ratio of the resistances are $R_5 : R_6 : R_7 : R_8 = 1 : 1 : \frac{1}{2} : \frac{1}{4}$.

The back-coupling resistors $R_6$, $R_7$ and $R_8$ are not connected permanently to the line 6, but are connected in parallel to resistor $R_5$ via the switches 30, 29 and 28 from instance to instance.

The output 39 of the operational amplifier 40 is connected to a voltage divider which is formed from the two resistors $R_9$ and $R_{10}$. The ratio of the two resistors is $R_9 : R_{10} = 15 : 1$. The tap 33 of the voltage divider or the output 39 of the operational amplifier can be connected to the output line 9 with the aid of the change-over switch 31. The switch 31 itself is controlled via the control line 34.

The inputs designated by $S_1$, $S_2$, $S_3$, being the inputs for the corresponding bits of the PCM word, are connected both to the digital/analogue converter 4 and to the current-voltage converter 7, namely all three inputs via an OR-gate 35 to the first input of the EXOR gate 16, $S_1$ to the change-over switch 31, $S_2$ and $S_3$ via an AND-gate 37 to the switch 30, $S_2$ to the switch 29, $S_3$, $S_2$ and the inversal of $S_1$ via an OR-gate 36 to the switch 28. This type of connection of the inputs $S_1$, $S_2$, $S_3$ to the switches 28, 29, 30 and 31 forms a small logic, for which the following truth table applies. The table indicates at the same time which relative output voltages appear on the output line 9.

| S | $S_1$ | $S_2$ | $S_3$ | $X_1$ | $X_2$ | $X_3$ | $2S-1$ |
|---|---|---|---|---|---|---|---|
| 7 | 1 | 1 | 1 | 1 | 1 | 1 | 64 |
| 6 | 1 | 1 | 0 | 0 | 1 | 1 | 32 |
| 5 | 1 | 0 | 1 | 0 | 0 | 1 | 16 |
| 4 | 1 | 0 | 0 | 0 | 0 | 0 | 8 |
| 3 | 0 | 1 | 1 | 1 | 1 | 1 | 4 |
| 2 | 0 | 1 | 0 | 0 | 1 | 1 | 2 |
| 1 | 0 | 0 | 1 | 0 | 0 | 1 | 1 |
| 0 | 0 | 0 | 0 | 0 | 0 | 1 | — |

The mode of operation of the segment digital-/analogue converter is as follows: via the inputs $B_1$ to $B_5$ the values logic 0 or 1 are put in, depending on the PCM word to be decoded. Via the input VA the sign of the PCM-word is put onto line 57 and in inverse form onto control line 18. The output current $i_2$ of the weighting network $R_1$, $R_2$ then amounts to $$i_2 = i_0 \sum_{j=0}^{5} B_j \cdot \mu_j$$

with $i_o$ = proportionality factor
$B_j$ = logical value = 0 or 1
$\mu_j$ = dimensionless weighting factor (in the depicted weighting network 1, 2, 4, 8, 16, 32).

The current $i_4$ is subtracted from this current constantly. By the resistance $R_4$ and the negative reference voltage $-U_1$, it is so adjusted that it is equal to the maximum possible value of $i_2$, the output current of the weighting network:

$$i_4 = i_0 \sum_{j=0}^{5} \mu_j.$$

The resistor $R_3$ is connected either to the positive reference voltage $+U_o$ or to earth via the switch 27. In the first instance, in accordance with VZ = 1 or positive sign, there flows through $R_3$ a current $i_3$ which according to the amount is equal to $i_4$:

$$i_3 = i_4$$

The current $i_3$ and $i_4$ thus cancel one another out. In this case the input current $i_1$ in the operational amplifier 40 is equal to the output current $i_2$ of the weighting network:

$$i_1 = i_2$$

If the sign is reversed, while the binary number B remains unaltered, then there is now applied to the control line 18 the reverse logical value relative to the first instance. In this way via the EITHER-OR-gates 11 to 16 all of the input values $B_o$ to $B_5$ are inverted. Furthermore, the switch 27 is changed over, so that now the resistor $R_3$ is connected to earth. Then current $i_1$ at the input of the operational amplifier 40 has the same value as previously, but the reverse direction.

This fact is easy to prove by the following calculation: If the inverted input values are designated by $\bar{B}_j$ and if $R_4$ is so selected that through it there flows the current $$i_4 = i_0 \sum_{j=0}^{5} \mu_j,$$

in other words the maximum possible value of $i_2$, then there applies $i_1 = i_2 - i_4$ or $$i_1 = i_0 \sum_{j=0}^{5} \overline{B_j}\mu_j - i_0 \sum_{j=0}^{5} \mu_j$$

$$= i_0 \sum_{j=0}^{5} \mu_j (\overline{B_j} - 1)$$

Since $(\overline{B_j} - 1) = -B_j$, as can be seen with reference to the truth table

| $B_j$ | $\overline{B_j}$ |
|---|---|
| 0 | 1 |
| 1 | 0 | as end result for the current $i_1$ emerges $$i_1 = -i_0 \sum_{j=0}^{5} B_j \cdot \mu_j$$

This current is amountwise equal to the current in the first instance. It has, however, the reversed sign.

In this way the sign of the PCM-word can be regarded simply. The pre-requisite is only that the negative reference voltage $-U_1$ and the resistor $R_4$ as well as the resistor $R_3$ are so selected that each $i_3$ and $i_4$ become equal to the maximum sum of all the weighting currents on the output line 6.

$$(i_3 = i_4 = i_2 \max = i_0 \sum_{j=0}^{5} \mu_j).$$

The mode of operation of the current-voltage converter 7 is as follows: if all of the switches 28, 29, 30 connect the relevant resistors to earth, only the resistors $R_5$ acts as back-coupling resistor for the operational amplifier 40. At the output line 39 of the operational amplifier 40 a voltage arises which is designated by $V_a$. By switching switch 30 into its other position, resistor 6 is connected to the input line 6 and thus parallel to $R_5$ as back-coupling resistors. In this way the overall resistance is reduced by half to $\frac{1}{2} R_5$. Accordingly the output voltage is reduced to the value $\frac{1}{2} V_a$. The additional connection of resistor $R_7$ lowers the overall back-coupling resistance once again by the factor 2 to the value $\frac{1}{4} R_5$. If finally also switch 28 is switched into the other switching position, as overall back-coupling resistance emerges the value $\frac{1}{8} R_5$. In accordance with these resistances output voltages emerge which behave as $1 : \frac{1}{2} : \frac{1}{4} : \frac{1}{8}$.

To fulfill all specifications for the transfer resistance of the current-voltage converter, in accordance with CCITT, at the output 39 of the operational amplifier 40 additionally a voltage divider can be switched in. This voltage divider has a resistance ratio of $R_9 : R_{10} = 15 : 1$. By switching switch 31 the output voltage of the operational amplifier can be weakened by the factor 16. This passive attenuation at the output of the operational amplifier, which does not influence the dynamics region of the operational amplifier, is a central point of the invention. The essential advantage consists in that the influences on the output voltage of the operational amplifier 40 arising from the zero point errors of the operational amplifier and from leakage currents in the switches 28, 29 and 30 are attenuated by the factor 16 in the most sensitive (lowest) output voltage range and thus act in a far less disturbing manner.

Figure 4:
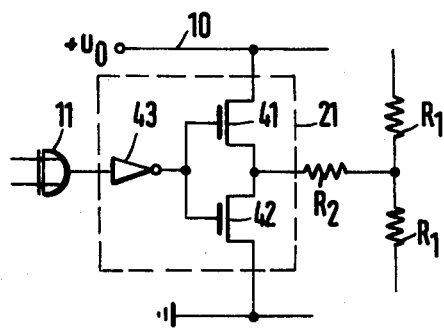
FIGS. 4 and 5 show two electronic switches which are used in the circuit in accordance with FIG. 3.

For supplementation of FIG. 1, FIG. 4 shows the circuit of the switches 21 . . . 27 in a more detailed manner. Each of these switches consists of a combination, of the two complimentary field effect transistors 41 and 42, known in literature under the name of CMOS Invertor, which are controlled jointly by the EXOR-gate 11 via the invertor 43. The invertor 43 prevents the inversion of the input signal. The switch consists of known CMOS components.

The two transistors 41 and 42 lie in series between earth and the feed line 10, to which the positive reference voltage $+U_o$ is applied. Connected to the connection of the two transistors is a cross resistor $R_2$ of the weighting network.

Figure 5:
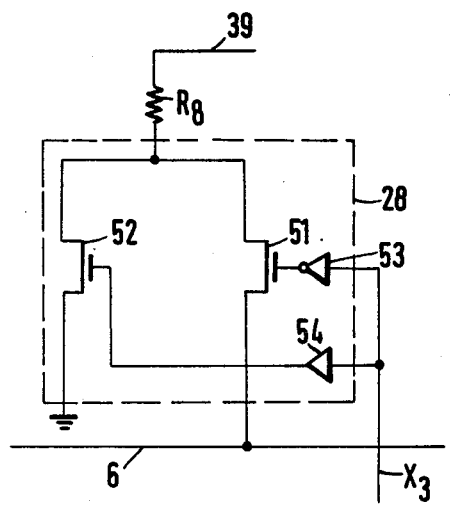

An example for the switches 28 . . . 31 is shown in FIG. 5. The switch consists of the two field effect transistors 51 and 52, which are controlled by the inverter driver 53 and by the driver 54 respectively. Depending on the logical state on the line $X_3$, either the transistor 51 or the transistor 52 is blocked or conductive.

The segment digital/analogue converter is very simple and uncritical and can be constructed in a simple manner as an integrated circuit. It can serve as a basic component of a Codec, which fulfils the CCITT conditions for the A-Law. For this purpose, the input $B_0$ has been connected fixedly to the state 0. By changing the logic between the inputs $S_1$, $S_2$, $S_3$ and the switches 28, 29, 30, 31 and by changed connection of $B_5$, also the U—Law can be fulfilled.

I claim:

1. A segment digital/analogue converter for conversion of an eight-bit PCM-word into an analogue output voltage in accordance with the CCITT A-law, with a weighting network including a resistor chain and a stepwise switched operational amplifier, with inputs for connection of each bit of said PCM-word with said weighting network and said amplifier via digital gates and low-impedance switches and with a control line for controlling the sign of said output voltage in accordance with the sign-bit of the PCM-word, comprising an electrical connection to ground of the one end of the weighting network's resistor chain, an electrical connection of the other end of the resistor chain, to the first input of an operational amplifier, and connection of the second input of the amplifier to ground;

a source of negative reference voltage $(-U_1)$;

a first resistor ($R_4$) connecting the output (6) of the weighting network to said source of negative reference voltage $(-U_1)$, the value of said first resistor ($R_4$) being such to give rise of a current ($i_4$) being equal in value to the maximum possible output current of said weighting network;

a second resistor ($R_3$) connecting the output (6) of said weighting network to a first low-impedance switch (27), which is controlled by the sign-bit (VZ) of said PCM-word and which switches said second resistor ($R_3$) either to ground or to a positive reference voltage $(+U_o)$, the value of said second resistor also being such to give rise of a current ($I_3$) being equal in value to the maximum possible output current of said weighting network;

a voltage divider ($R_9$, $R_{10}$) having a resistance ratio of 15:1, and an intermediate tap (33), connecting the output (39) of the operational amplifier (40) to ground; and a second low-impedance switch (31) which is controlled by the most significant bit ($S_1$) of said PCM-word and which is connected to connect either the output (39) of the operational amplifier (40) or the tap (33) of said voltage divider ($R_9$, $R_{10}$) to the output (9) of the segment digital/analogue converter.

* * * * *